United States Patent
Oh

(10) Patent No.: US 12,532,754 B2
(45) Date of Patent: Jan. 20, 2026

(54) SEMICONDUCTOR DEVICE HAVING WAFER-TO-WAFER BONDING STRUCTURE AND MANUFACTURING METHOD THEREOF

(71) Applicant: SK hynix Inc., Icheon-si (KR)

(72) Inventor: Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/736,384

(22) Filed: Jun. 6, 2024

(65) Prior Publication Data

US 2024/0321756 A1    Sep. 26, 2024

Related U.S. Application Data

(60) Continuation of application No. 18/309,781, filed on Apr. 29, 2023, now Pat. No. 12,040,280, which is a
(Continued)

(30) Foreign Application Priority Data

Aug. 4, 2020    (KR) ........................ 10-2020-0097352

(51) Int. Cl.
*H01L 23/538*    (2006.01)
*H01L 21/762*    (2006.01)
(Continued)

(52) U.S. Cl.
CPC ........ *H01L 23/5384* (2013.01); *H01L 21/762* (2013.01); *H01L 21/76802* (2013.01);
(Continued)

(58) Field of Classification Search
CPC ............. H01L 23/5384; H01L 23/5386; H01L 23/481; H01L 23/13; H01L 23/485;
(Continued)

(56) References Cited

U.S. PATENT DOCUMENTS 9,219,032 B2    12/2015    Ramachandran et al.
2013/0203214 A1    8/2013    Isobe
(Continued)

FOREIGN PATENT DOCUMENTS

| CN | 109148494 A | 1/2019 |
| KR | 1020130107591 A | 10/2013 |
| KR | 10-2018-0136874 A | 12/2018 |

OTHER PUBLICATIONS

Office Action/Rejection issued by the Korean Patent Office, in counterpart Patent Application KR10-2020-0097352 on Jul. 4, 2024.
(Continued)

*Primary Examiner* — Dao H Nguyen

(57) ABSTRACT

A method for manufacturing a semiconductor device comprises: forming isolation layers in a front surface of an upper wafer substrate; forming a through hole that exposes one of the isolation layers, through the upper wafer substrate from a back surface of the upper wafer substrate; forming a first dielectric layer that fills the through hole; defining a lower wafer including a lower wafer substrate, a second dielectric layer defined on the lower wafer substrate, and a first wiring line disposed in the second dielectric layer; bonding a top surface of the second dielectric layer and a bottom surface of the first dielectric layer; forming a third dielectric layer on the front surface of the upper wafer substrate; forming a through via that passes through the third dielectric layer, the one isolation layer, the first dielectric layer; and forming a second wiring line coupled to the through via.

20 Claims, 16 Drawing Sheets

Related U.S. Application Data division of application No. 17/148,147, filed on Jan. 13, 2021, now Pat. No. 11,676,901.

(51) Int. Cl.
  *H01L 21/768* (2006.01)
  *H01L 25/065* (2023.01)
  *H10B 43/27* (2023.01)
  *H10D 62/10* (2025.01)

(52) U.S. Cl.
  CPC ...... *H01L 23/5386* (2013.01); *H01L 25/0657* (2013.01); *H10B 43/27* (2023.02); *H10D 62/115* (2025.01)

(58) Field of Classification Search
  CPC .......... H01L 23/49827; H01L 23/5226; H01L 21/762; H01L 21/76802; H01L 21/76898; H01L 21/2007; H01L 21/76224; H01L 21/76895; H01L 25/0657; H01L 25/50; H01L 25/18; H01L 25/0756; H10D 62/115; H10D 88/00; H10D 84/038; H10D 88/01

See application file for complete search history.

(56) References Cited

U.S. PATENT DOCUMENTS

| | | | |
|---|---|---|---|
| 2015/0375992 A1* | 12/2015 | Chou | B81C 1/00238 257/415 |
| 2016/0093591 A1 | 3/2016 | Lan | |
| 2018/0025970 A1* | 1/2018 | Kao | H10D 84/038 257/401 |
| 2018/0277517 A1* | 9/2018 | Kim | H10N 50/10 |
| 2018/0366508 A1* | 12/2018 | Goto | H10F 39/018 |
| 2025/0220929 A1* | 7/2025 | Kim | H01L 24/80 |

OTHER PUBLICATIONS

Office Action/Rejection issued by the Chinese Patent Office, in counterpart Patent Application 202110307259.0 on Jun. 4, 2025.

\* cited by examiner

SEMICONDUCTOR DEVICE HAVING WAFER-TO-WAFER BONDING STRUCTURE AND MANUFACTURING METHOD THEREOF

CROSS-REFERENCE TO RELATED APPLICATION

The present application is a continuation of pending U.S. application Ser. No. 18/309,781, which was filed on Apr. 29, 2023, which is a divisional application of a U.S. patent application Ser. No. 17/148,147, filed on Jan. 13, 2021, now issued as U.S. Pat. No. 11,676,901 on Jun. 13, 2023, which claims priority under 35 U.S.C. § 119(a) to Korean Patent Application No. 10-2020-0097352 filed in the Korean Intellectual Property Office on Aug. 4, 2020, which is incorporated herein by reference in its entirety.

BACKGROUND

1. Technical Field

Various embodiments generally relate to a semiconductor technology, and particularly, to a semiconductor device having a wafer-to-wafer bonding structure and a manufacturing method thereof.

2. Related Art

Recently, as measures for achieving the high degree of integration and large capacity of a semiconductor device, a structure has been proposed in which components included in the semiconductor device are fabricated on not a single wafer but on at least two wafers, and then the wafers are bonded to each other to couple the components.

SUMMARY

Various embodiments are directed to measures capable of improving the efficiency of a semiconductor device fabrication process and of contributing to reducing failures that may occur during the fabrication process.

In an embodiment, a semiconductor device having a wafer-to-wafer bonding structure includes: a lower wafer including a first substrate, a first dielectric layer that is defined on the first substrate, and a first wiring line that is defined in the first dielectric layer; an upper wafer including a second substrate, an isolation layer that is defined in an upper surface of the second substrate, a second dielectric layer, bonded to an upper surface of the first dielectric layer, that covers a lower surface of the second substrate and that includes at least one portion defined in the lower surface of the second substrate below and in contact with the isolation layer, and a third dielectric layer that is defined on the upper surface of the second substrate, and a second wiring line that is defined on the third dielectric layer; and a through via passing through, under the second wiring line, the third dielectric layer, the isolation layer, the second dielectric layer under the isolation layer and the first dielectric layer, and coupling the second wiring line and the first wiring line.

In an embodiment, a semiconductor device having a wafer-to-wafer bonding structure includes: a lower wafer including a first substrate, a first dielectric layer that is defined on the first substrate, and a first wiring line that is defined in the first dielectric layer; an upper wafer including a second substrate, an isolation layer that is defined in an upper surface of the second substrate, a through hole that extends from a lower surface of the second substrate towards the upper surface to expose a lower surface of the isolation layer, a second dielectric layer that fills the through hole, covers the lower surface of the second substrate and is bonded to an upper surface of the first dielectric layer, a third dielectric layer that is defined on the upper surface of the second substrate, and a second wiring line that is defined on the third dielectric layer; and a through via passing through, under the second wiring line, the third dielectric layer, the isolation layer, the second dielectric layer under the isolation layer and the first dielectric layer, and coupling the second wiring line and the first wiring line.

In an embodiment, a method for manufacturing a semiconductor device having a wafer-to-wafer bonding structure may include: forming isolation layers in a front surface of an upper wafer substrate; forming a through hole that exposes one of the isolation layers, through the upper wafer substrate from a back surface of the upper wafer substrate facing away from the front surface; forming a first dielectric layer that fills the through hole and covers the back surface; defining a lower wafer including a lower wafer substrate, a second dielectric layer that is defined on the lower wafer substrate, and a first wiring line that is disposed in the second dielectric layer; bonding a top surface of the second dielectric layer of the lower wafer and a bottom surface of the first dielectric layer; forming a third dielectric layer on the front surface of the upper wafer substrate; forming a through via that passes through the third dielectric layer, the one isolation layer, the first dielectric layer under the one isolation layer and the second dielectric layer, and couples to the first wiring line; and forming, on the third dielectric layer, a second wiring line that is coupled to the through via.

DETAILED DESCRIPTION

Figure 1:
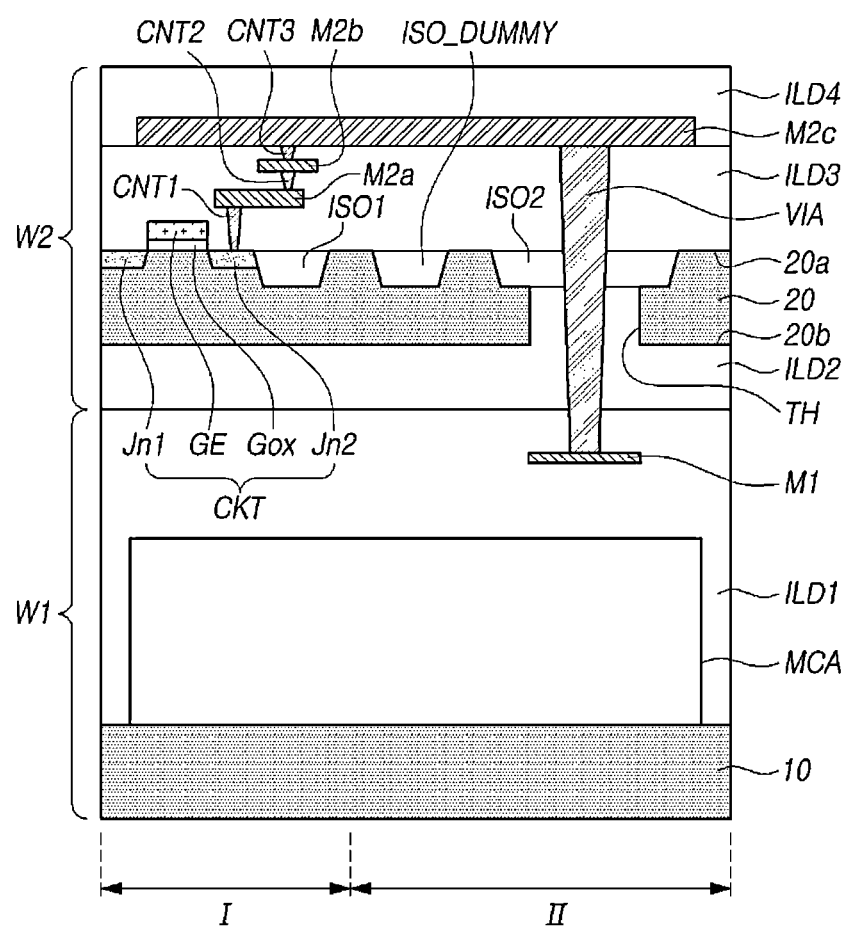
FIG. 1 is a cross-sectional view illustrating a representation of a semiconductor device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a cross-sectional view illustrating a representation of a semiconductor device in accordance with an embodiment of the disclosure.

Referring to FIG. 1, a semiconductor device in accordance with an embodiment of the disclosure may include a lower wafer W1, an upper wafer W2 that is bonded onto the lower wafer W1, and a through via VIA that passes through a bonding surface between the upper wafer W2 and the lower wafer W1 and that couples a wiring line M2c of the upper wafer W2 and a wiring line M1 of the lower wafer W1.

The lower wafer W1 may include a first substrate 10, a memory cell array MCA, a first dielectric layer ILD1, and the wiring line M1.

The first substrate 10 may be a single crystal semiconductor layer. For example, the first substrate 10 may be a bulk silicon substrate, a germanium substrate, a silicon-germanium substrate, or an epitaxial thin film that is formed through selective epitaxial growth.

Although not illustrated, the memory cell array MCA may include a plurality of memory cells. The memory cells may be accessed through word lines and bit lines. Although the present embodiment illustrates the lower wafer W1 as a cell wafer that includes the memory cell array MCA, it is to be noted that the technical spirit of the disclosure is not necessarily limited thereto.

The first dielectric layer ILD1 may be defined on the first substrate 10 to cover the memory cell array MCA. The first dielectric layer ILD1 may include an oxide, for example, silicon oxide ($SiO2$). In an embodiment, the first dielectric layer ILD1 may have a multi-layered structure.

The wiring line M1 may be defined in the first dielectric layer ILD1. Although not illustrated, the wiring line M1 may be coupled to the memory cell array MCA.

The upper wafer W2 may include a second substrate 20, isolation layers ISO1 and ISO2, and a second dielectric layer ILD2. The upper wafer W2 may further include a circuit element CKT, wiring lines M2a to M2c, a third dielectric layer ILD3, and a fourth dielectric layer ILD4.

The second substrate 20 may be formed of the same material as the first substrate 10. However, the technical spirit of the disclosure is not limited to embodiments in which the second substrate 20 is formed of the same material as the first substrate 10. The second substrate 20 may have a front surface 20a and a back surface 20b, which faces away from the front surface 20a.

The semiconductor device may include a first region I and a second region II. The first region I may correspond to a circuit region in which the circuit element CKT is disposed, and the second region II may correspond to a via region in which the through via VIA is positioned.

The isolation layers ISO1 and ISO2 may be formed in the front surface 20a of the second substrate 20. The isolation layers ISO1 and ISO2 may include an oxide. For example, the isolation layers ISO1 and ISO2 may include an oxide having an excellent gap-fill characteristic, such as a flowable oxide (FOX), a spin-on-glass (SOG) and a high density plasma (HDP). In some embodiments, the isolation layers ISO1 and ISO2 may each have a structure in which a nitride and an oxide are stacked.

The isolation layers ISO1 and ISO2 may include a first isolation layer ISO1, which is formed in the first region I of the second substrate 20, and a second isolation layer ISO2, which is formed in the second region II of the second substrate 20.

In order to secure the stable operation of the circuit element CKT and pattern uniformity at the boundary between the first region I and the second region II, a dummy isolation layer ISO_DUMMY may be additionally formed at an edge of the second region II, which is adjacent to the first region I. The dummy isolation layer ISO_DUMMY may be formed together with the first and second isolation layers ISO1 and ISO2 when the first and second isolation layers ISO1 and ISO2 are formed.

The second substrate 20 may be divided into a field region in which the first and second isolation layers ISO1 and ISO2 and the dummy isolation layer ISO_DUMMY are formed, and an active region outside the field region. In the second region II, a through hole TH, which passes through the second substrate 20, may be formed under the second isolation layer ISO2. The through hole TH may couple the back surface 20b of the second substrate 20 and the second isolation layer ISO2.

The second dielectric layer ILD2 may fill the through hole TH, and may cover the back surface 20b of the second substrate 20. The second dielectric layer ILD2 may include silicon oxide (SiO2). The second dielectric layer ILD2 may be in contact with the second substrate 20 on the inner sidewall of the second substrate 20, which is defined by the through hole TH. Due to this fact, compared to a device without a through hole TH, the contact area between the second substrate 20 and the second dielectric layer ILD2 may be increased, so that the coupling force between the second substrate 20 and the second dielectric layer ILD2 is increased. The bottom surface of the second dielectric layer ILD2 may be bonded to the top surface of the first dielectric layer ILD1 of the lower wafer W1.

The circuit element CKT may be formed in the first region I of the front surface 20a of the second substrate 20. For example, the circuit element CKT may configure a logic circuit for controlling the memory cell array MCA defined in the lower wafer W1.

FIG. 1 illustrates a transistor as an example of the circuit element CKT. The transistor may include a gate dielectric layer Gox, which is disposed on the front surface 20a of the second substrate 20, a gate electrode GE, which is disposed on the gate dielectric layer Gox, and junctions Jn1 and Jn2, which are defined in the active region of the second substrate 20 on both sides of the gate electrode GE. The junctions Jn1 and Jn2 are regions that are formed by implanting an n-type or p-type impurity into the active region of the second substrate 20. One of the junctions Jn1 and Jn2 may be used as a source region of the transistor, and the other may be used as a drain region of the transistor. The transistor is used for illustrative purposes, and in some embodiments the circuit element CKT may include, for example, a diode, a capacitor, an inductor or the like.

The third dielectric layer ILD3 may be defined on the front surface 20a of the second substrate 20 to cover the circuit element CKT. The third dielectric layer ILD3 may include an oxide such as a BPSG (Boro Phospho Silicate Glass), a USG (Undoped Silicate Glass) and an SOG (Spin On Glass). In an embodiment, the third dielectric layer ILD3 may have a multi-layered structure. The wiring line M2c may be disposed on the third dielectric layer ILD3, and may be coupled to the circuit element CKT through the wiring lines M2a and M2b and contacts CNT1 to CNT3, which are defined in the third dielectric layer ILD3. The fourth dielectric layer ILD4 may be defined on the third dielectric layer ILD3 to cover the wiring line M2c.

The through via VIA may be coupled to the wiring line M1 by passing through the third dielectric layer ILD3, the second isolation layer ISO2, the second dielectric layer ILD2 and the first dielectric layer ILD1 under the wiring line M2c, and may electrically couple the wiring line M2c and the wiring line M1. Although the present embodiment illustrates one through via VIA disposed in one though hole TH, the disclosure is not limited thereto. The number of through vias VIA disposed in one through hole TH may be two or greater.

Unlike the present embodiment, a method may be used in which a pad exposed on the top surface of a first dielectric layer of a lower wafer and a pad exposed on the bottom surface of a second dielectric layer of an upper wafer are formed and the lower wafer and the upper wafer are electrically coupled through bonding of the pads. The bottom surface of the second dielectric layer of the upper wafer and the top surface of the first dielectric layer of the lower wafer should be flat ideally, but may not be flat actually. If a surface is not flat, then a nanogap may be created at the bonding surface between the upper wafer and the lower wafer, and due to the presence of the nanogap, a failure may occur in which the pad of the upper wafer and the pad of the lower wafer are not coupled to each other.

According to the present embodiment, the wiring line M2c of the upper wafer W2 and the wiring line M1 of the lower wafer W1 are electrically coupled using the through via VIA, which passes through the bonding surface between the upper wafer W2 and the lower wafer W1. Therefore, even though there exists a nanogap at the bonding surface between the upper wafer W2 and the lower wafer W1, it is possible to prevent the occurrence of a failure in which the wiring line M2c of the upper wafer W2 and the wiring line M1 of the lower wafer W1 are not coupled to each other.

FIGS. 2A to 2F are representations of cross-sectional views to assist in the explanation of a semiconductor device in accordance with an embodiment of the disclosure, according to a process sequence.

Figure 2A:
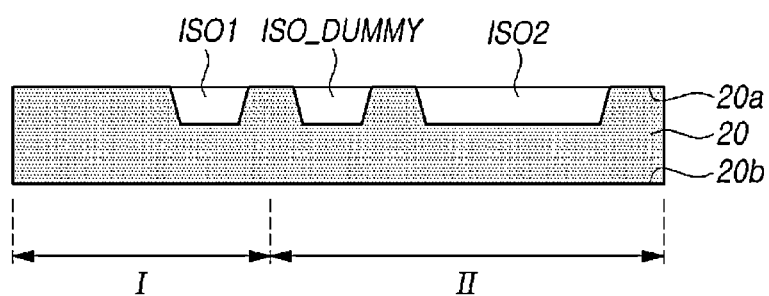
FIGS. 2A to 2F are representations of cross-sectional views to assist in the explanation of the semiconductor device in accordance with the embodiment of the disclosure, according to a process sequence.

Referring to FIG. 2A, a first isolation layer ISO1 may be formed in a first region I of a second substrate 20, and a second isolation layer ISO2 may be formed in a second region II of a second substrate 20.

The first and second isolation layers ISO1 and ISO2 may be formed using a shallow trench isolation (STI) process. In detail, after a pad oxide layer and a pad nitride layer are sequentially formed on a front surface 20a of the second substrate 20, the pad nitride layer and the pad oxide layer may be patterned, and thereby, a part of the second substrate 20 corresponding to a field region may be exposed. After the exposed part of the second substrate 20 is etched, thereby forming a trench, a dielectric material may be used to fill in the trench, and, thereby, the first and second isolation layers ISO1 and ISO2 may be formed. The dielectric material may include an FOX (Flowable oxide), an SOG (Spin On Glass), an HDP (High Density Plasma), or the like.

During the process of forming the first and second isolation layers ISO1 and ISO2, a dummy isolation layer ISO_DUMMY may be additionally formed at an edge of the second region II, which is adjacent to the first region I.

Figure 2B:
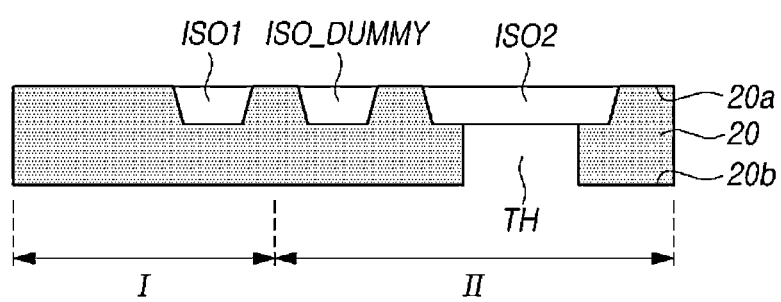

Referring to FIG. 2B, in the second region II, a through hole TH that exposes the second isolation layer ISO2 may be formed through the second substrate 20 from a back surface 20b of the second substrate 20 facing away from the front surface 20a. The depth of the through hole TH may have a value that is smaller than the thickness of the second substrate 20 by the depth of the second isolation layer ISO2. Therefore, compared to the formation of a through hole that passes through the entire thickness of the second substrate 20, here the etch thickness is smaller and the etching process may be comparatively reduced.

Figure 2C:
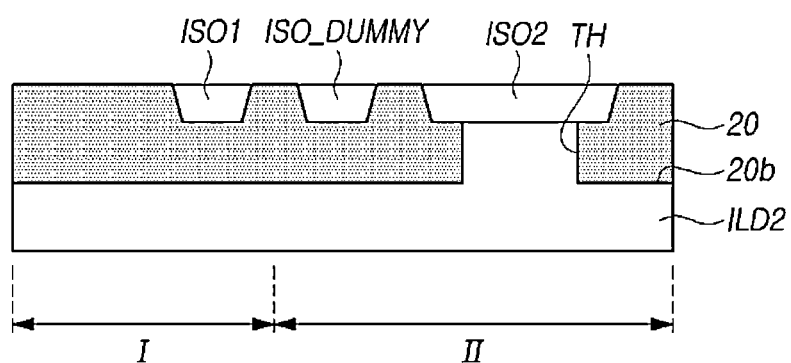

Referring to FIG. 2C, a second dielectric layer ILD2 that fills the through hole TH and covers the back surface 20b of the second substrate 20 may be formed. The second dielectric layer ILD2 may include silicon oxide. Thereafter, the bottom surface of the second dielectric layer ILD2 may be planarized by a chemical mechanical polishing (CMP) process. The second dielectric layer ILD2 may be in contact with the second substrate 20 on the inner sidewall of the second substrate 20, which is defined by the through hole TH. Due to this fact, the contact area between the second substrate 20 and the second dielectric layer ILD2 may be increased, so that the coupling force between the second substrate 20 and the second dielectric layer ILD2 is increased.

Figure 2D:
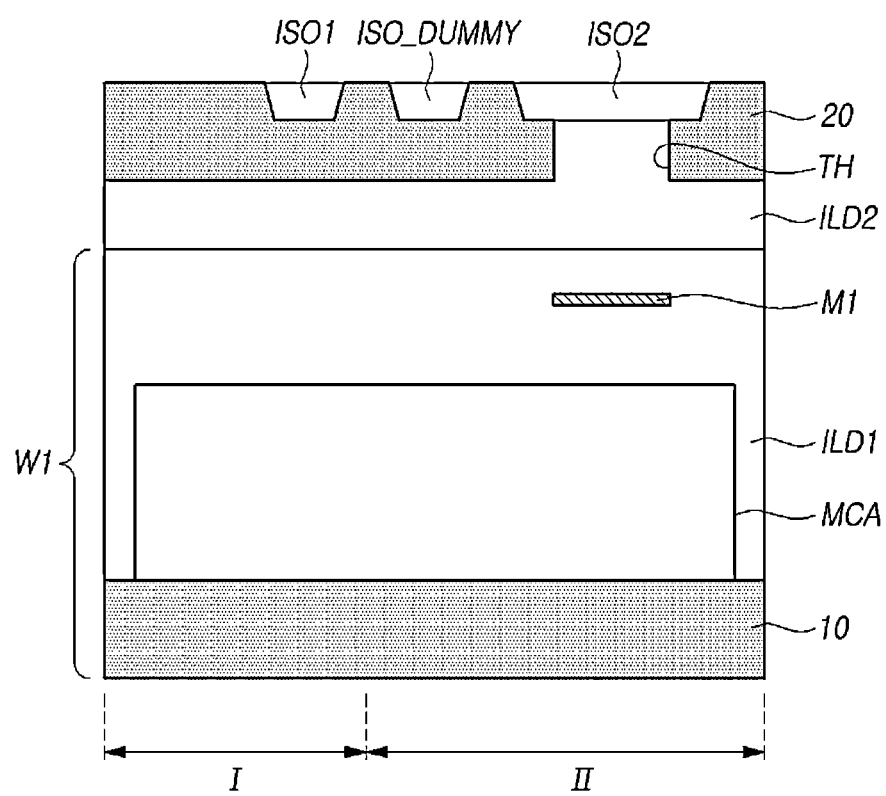

Referring to FIG. 2D, a lower wafer W1 may be bonded to the bottom surface of the second dielectric layer ILD2. The lower wafer W1 may include a first substrate 10, a memory cell array MCA that is defined on the first substrate 10, a first dielectric layer ILD1 that is defined on the first substrate 10 and covers the memory cell array MCA, and a wiring line M1 that is defined in the first dielectric layer ILD1. The top surface of the first dielectric layer ILD1 may configure one surface of the lower wafer W1, which is bonded to the second dielectric layer ILD2. The top surface of the first dielectric layer ILD1 may has a structure that is planarized through a CMP process. The first dielectric layer ILD1 may be formed of silicon oxide.

When silicon oxide is planarized by a CMP process, a planarized surface may exhibit hydrophobicity. The top surface of the first dielectric layer ILD1 and the bottom surface of the second dielectric layer IDL2, which are planarized by the CMP processes, may also have hydrophobicity properties. By performing plasma treatment or wet pretreatment on such surfaces, the surfaces may be converted to have hydrophilic properties, and as a result, OH— groups may adhere to the silicon surfaces. After the top surface of the first dielectric layer ILD1 and the bottom surface of the second dielectric layer IDL2 are bonded by the van der Waals force between the OH— groups at a room temperature, by removing only water molecules through heat treatment, a substantially strong covalent bond between silicon and oxygen atoms may be formed. Accordingly, the top surface of the first dielectric layer ILD1 and the bottom surface of the second dielectric layer IDL2 may be substantially and firmly bonded together.

Figure 2E:
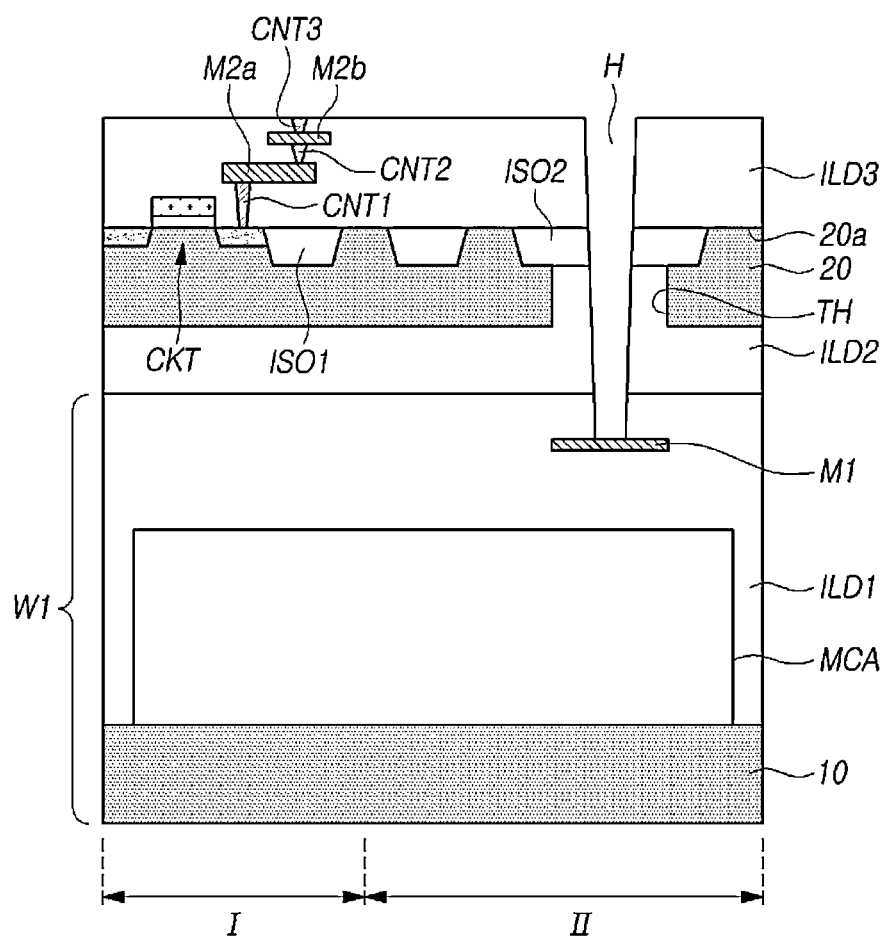

Referring to FIG. 2E, a circuit element CKT may be formed in a front surface 20a of the second substrate 20, and a third dielectric layer ILD3 that covers the circuit element CKT may be formed on the front surface 20a of the second substrate 20. The third dielectric layer ILD3 may have a multi-layered structure, and wiring lines M2a and M2b and contacts CNT1 to CNT3, which couple the circuit element CKT and the wiring lines M2a and M2b, may be formed in the third dielectric layer ILD3.

Thereafter, in the second region II, a hole H through the third dielectric layer ILD3, the second isolation layer ISO2, the second dielectric layer ILD2 and the first dielectric layer ILD1 may be formed to expose the wiring line M1 in the first dielectric layer ILD1.

Figure 2F:
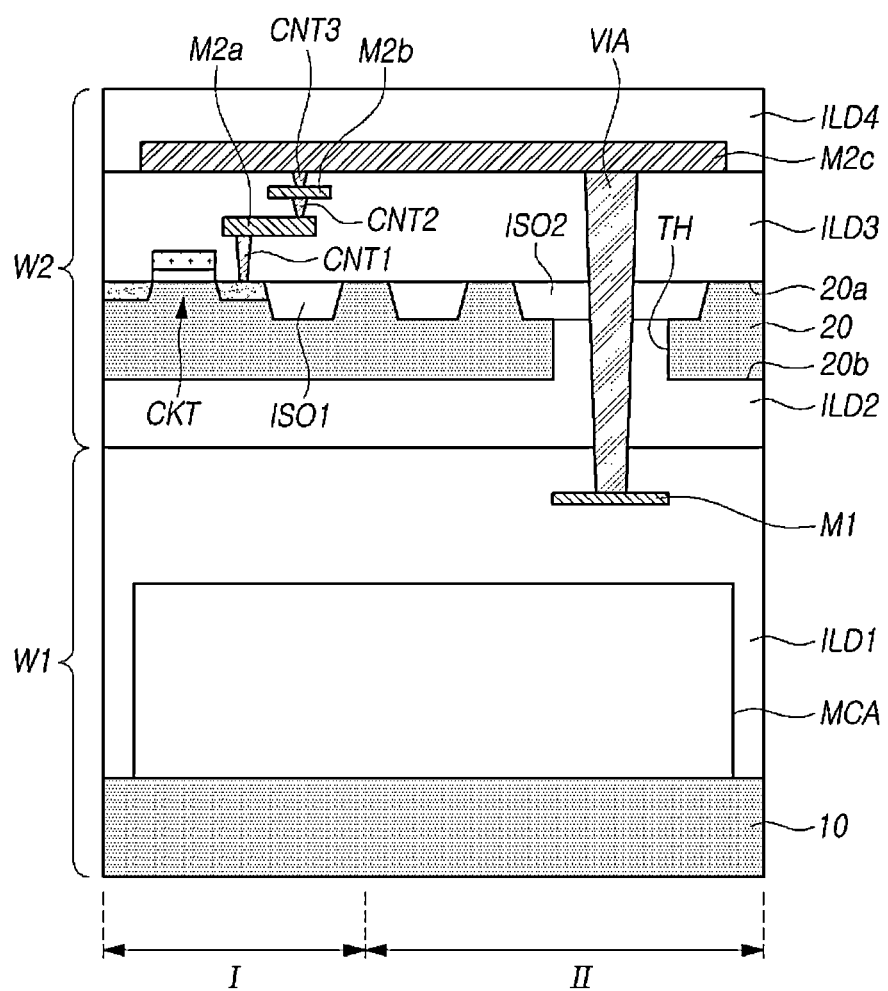

Referring to FIG. 2F, a conductive material may be filled in the hole H to form a through via VIA, which is coupled to the wiring line M1. A wiring line M2c may be formed on the third dielectric layer ILD3, and be coupled to the contact CNT3 and the through via VIA. A fourth dielectric layer ILD4, which covers the wiring line M2c, may be formed on the third dielectric layer ILD3.

During a process of fabricating at least one of the circuit elements CKT, the wiring lines M2a, M2b and M2c, the contacts CNT1 to CNT3 and the third and fourth dielectric layers ILD3 and ILD4, which are formed after the lower wafer W1 and the upper wafer W2 are bonded to each other, a CMP process may be used. During the CMP process, the semiconductor device is rotated by being brought into contact with a polishing pad, so the semiconductor device is subject to a shearing stress in a horizontal direction.

If the coupling force between a second substrate of an upper wafer and a second dielectric layer defined on the back surface of the second substrate is insufficient, a distortion may occur at the interface between the second substrate and the second dielectric layer during the CMP process, and thus, a failure may occur in which a lower wafer that is bonded to the second dielectric layer is misaligned with the upper wafer.

According to the present embodiment, because the second dielectric layer ILD2 is in contact with the second substrate 20 along the inner sidewall of the second substrate 20, previously defined by the through hole TH, the contact area between the second substrate 20 and the second dielectric layer ILD2 may be increased. As a consequence, the coupling force between the second substrate 20 and the second dielectric layer ILD2 is increased, thereby reducing or preventing the occurrence of a distortion at the interface between the second substrate 20 and the second dielectric layer ILD2. Accordingly, it is possible to contribute to suppressing the occurrence of a failure in which the lower wafer W1 bonded to the second dielectric layer ILD2 is misaligned with the upper wafer W2.

Figure 3:
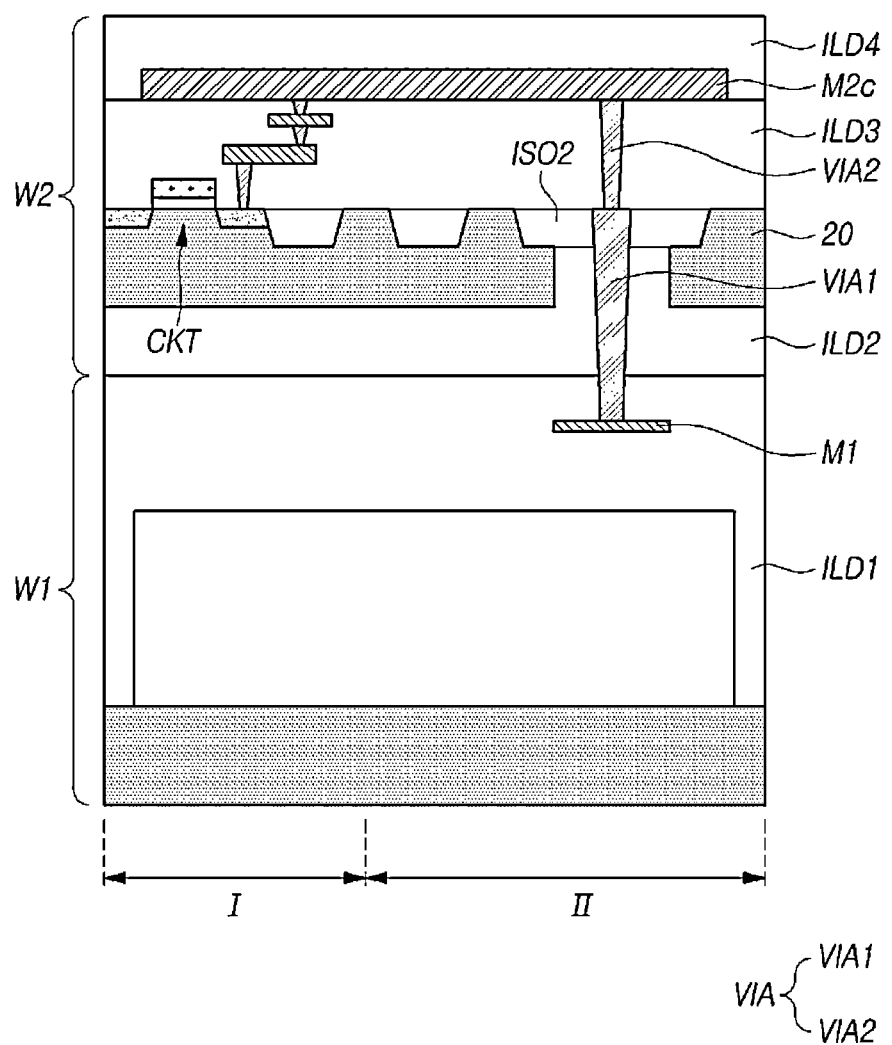
FIG. 3 is a cross-sectional view illustrating a representation of a structure of a through via of a semiconductor device in accordance with an embodiment of the disclosure.

FIG. 3 is a cross-sectional view illustrating a representation of a structure of a through via of a semiconductor device in accordance with an embodiment of the disclosure.

Referring to FIG. 3, a through via VIA may include a first via VIA1 and a second via VIA2. The first via VIA1 may pass through a second isolation layer ISO2, a second dielectric layer ILD2 and a first dielectric layer ILD1, and may be coupled to a wiring line M1. The second via VIA2 may pass through a third dielectric layer ILD3 under a wiring line M2c, and may be coupled to the first via VIA1.

The first via VIA1 may be formed by filling a hole with a conductive material. The hole may be formed by etching the second isolation layer ISO2, the second dielectric layer ILD2 under the second isolation layer ISO2 and the first dielectric layer ILD1 to expose the wiring line M1 after a lower wafer W1 and an upper wafer W2 are bonded.

The second via VIA2 may be formed by filling a hole with a conductive material. The hole may be formed by etching the third dielectric layer ILD3 after forming the third dielectric layer ILD3.

According to the present embodiment, because the depth of a hole formed through a single etching process may be reduced, it is possible to contribute to reducing or preventing a not-open failure of a hole.

Figure 4:
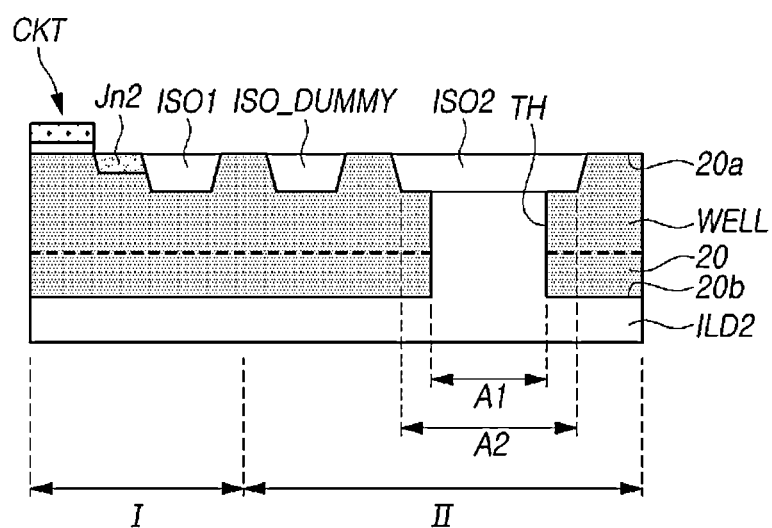
FIGS. 4 to 6 are cross-sectional views illustrating representations of structures of through holes of semiconductor devices in accordance with embodiments of the disclosure.
Figure 5:
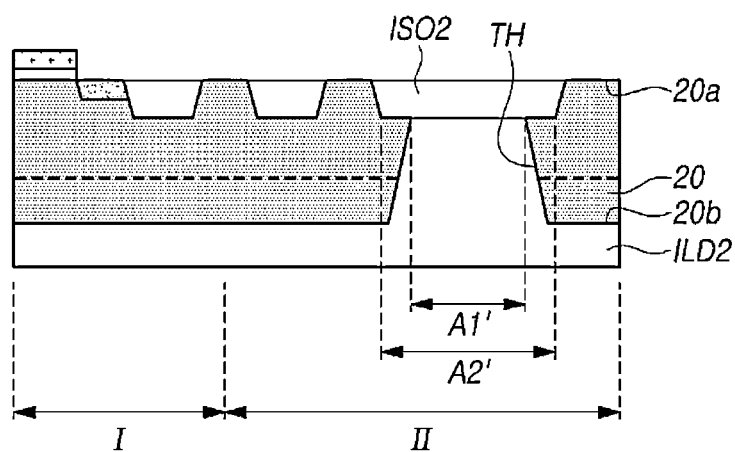
Figure 6:
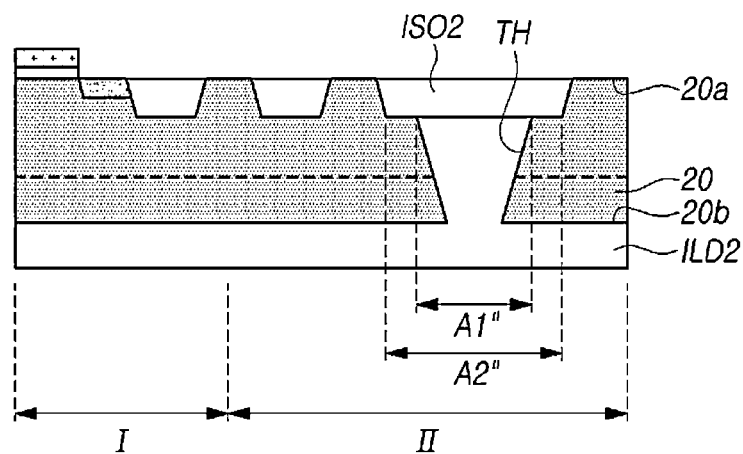

FIGS. 4 to 6 are cross-sectional views illustrating representations of structures of through holes of semiconductor devices in accordance with embodiments of the disclosure.

Referring to FIG. 4, a well region WELL may be defined as impurity ions are doped into a second substrate 20. A junction region Jn2 of a circuit element CKT may be formed in the well region WELL of the second substrate 20.

First and second isolation layers ISO1 and ISO2 may each have a width that decreases, or tapers, from a front surface 20a to a back surface 20b of the second substrate 20. The depth of each of the first and second isolation layers ISO1 and ISO2 may be shallower than the depth of the well region WELL. Like the first and second isolation layers ISO1 and ISO2, a dummy isolation layer ISO_DUMMY may also have a width that decreases in a direction from the front surface 20a of the second substrate 20.

A through hole TH may have a vertical sidewall. A width A1 of the through hole TH may have a value smaller than a width A2 of the bottom end of the second isolation layer ISO2. Due to a difference between A1 and A2, the inner sidewall of the second substrate 20 defined by the second isolation layer ISO2 and the through hole TH may have a step shape.

Referring to FIG. 5, in another embodiment, a through hole TH may be formed by etching a second substrate 20 such that a second isolation layer ISO2 is exposed from the back surface 20b of the second substrate 20. Due to an etch loading during the etching process, the through hole TH may have a width that decreases in a direction from the back surface 20b to the front surface 20a of the second substrate 20. In other words, as distance increases from a front surface 20a of the second substrate 20, the width of second isolation layer ISO2 may taper while the width of the through hole TH may increases.

A width A1' of the top end of the through hole TH, which meets the second isolation layer ISO2, may be smaller than a width A2' of the bottom end of the second isolation layer ISO2. Due to a difference between A1' and A2', the inner sidewall of the second substrate 20 defined by the second isolation layer ISO2 and the through hole TH may have a step shape.

Referring to FIG. 6, in a further embodiment, a second isolation layer ISO2 may have a width that decreases as it is distant from a front surface 20a of a second substrate 20. A through hole TH may be formed by etching a trench for forming the second isolation layer ISO2 and then etching the second substrate 20 under the trench. Due to an etch loading during the etching process, the through hole TH may have a width that decreases as it approaches a back surface 20b of the second substrate 20.

After a sacrificial layer (not illustrated) is filled in the through hole TH, the second isolation layer ISO2 may be formed in the trench. Then, the sacrificial layer may be removed, and a second dielectric layer ILD2 may be formed to fill the through hole TH exposed due to the removal of the sacrificial layer and to cover the back surface 20b of the second substrate 20.

A width A1" of the top end of the through hole TH that meets the second isolation layer ISO2 may have a value smaller than a width A2" of the bottom end of the second isolation layer ISO2. Due to a difference between A1" and A2", the inner sidewall of the second substrate 20 defined by the second isolation layer ISO2 and the through hole TH may have a step shape.

Figure 7:
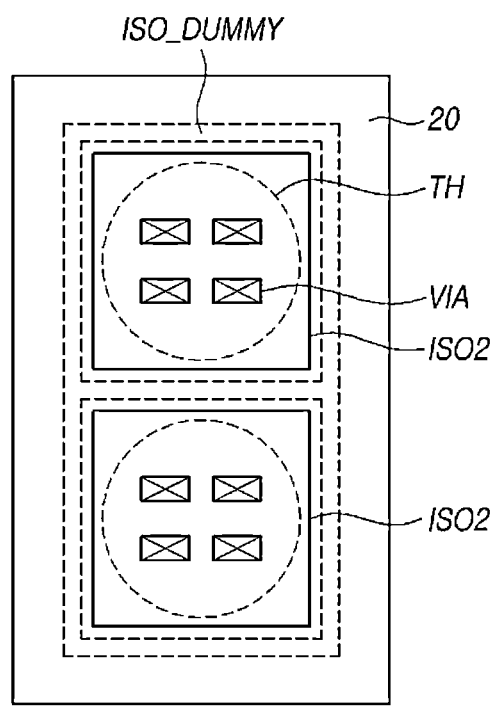
FIG. 7 is a top view illustrating a representation of an example of a semiconductor device in accordance with an embodiment of the disclosure.
Figure 8:
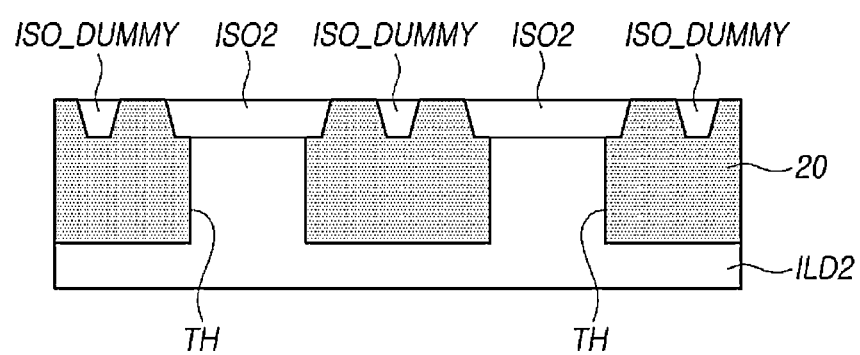
FIG. 8 is a cross-sectional view illustrating a substrate of FIG. 7.

FIG. 7 is a top view illustrating a representation of a semiconductor device in accordance with an embodiment of the disclosure, and FIG. 8 is a cross-sectional view illustrating a substrate of FIG. 7.

Referring to FIG. 7, a plurality of second isolation layers ISO2 may be defined in a second substrate 20. A dummy isolation layer ISO_DUMMY may be provided in a shape that surrounds each of the second isolation layers ISO2.

Referring to FIGS. 7 and 8, a plurality of through holes TH, which are individually coupled to the second isolation layers ISO2, may be formed under the second isolation layers ISO2. Each through hole TH may be coupled to a corresponding second isolation layer ISO2 by passing through the second substrate 20. Each through hole TH may be formed to have a diameter sufficiently larger than that of each through via VIA such that a plurality of through vias VIA may be disposed therein.

Figure 9:
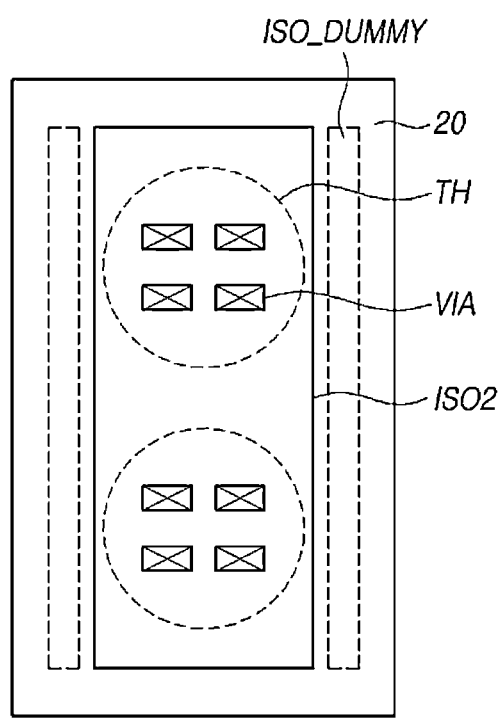
FIG. 9 is a top view illustrating a representation of a semiconductor device in accordance with an embodiment of the disclosure.
Figure 10:
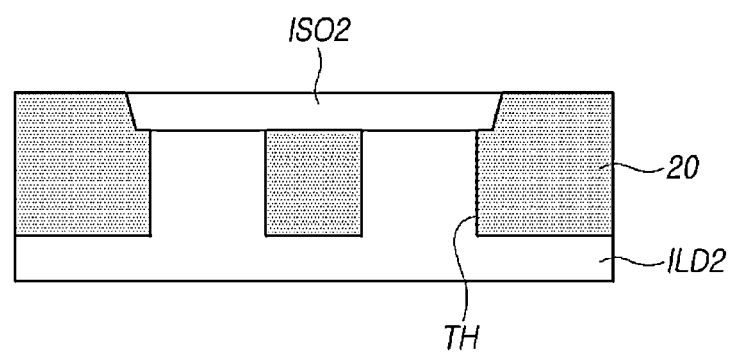
FIG. 10 is a cross-sectional view illustrating a substrate of FIG. 9.

FIG. 9 is a top view illustrating a representation of a semiconductor device in accordance with an embodiment of the disclosure, and FIG. 10 is a cross-sectional view illustrating a substrate of FIG. 9.

Referring to FIG. 9, a second isolation layer ISO2, which is coupled in common to a plurality of through holes TH, may be defined in a second substrate 20. A dummy isolation layer ISO_DUMMY may be defined around the second isolation layer ISO2. For example, in FIG. 9, the dummy isolation layer ISO_DUMMY extends along the long edges of the second isolation layer ISO2.

Referring to FIGS. 9 and 10, the plurality of through holes TH may be formed under the second isolation layer ISO2. The plurality of through holes TH may pass through the second substrate 20, and may be coupled in common to the one second isolation layer ISO2.

Figure 11:
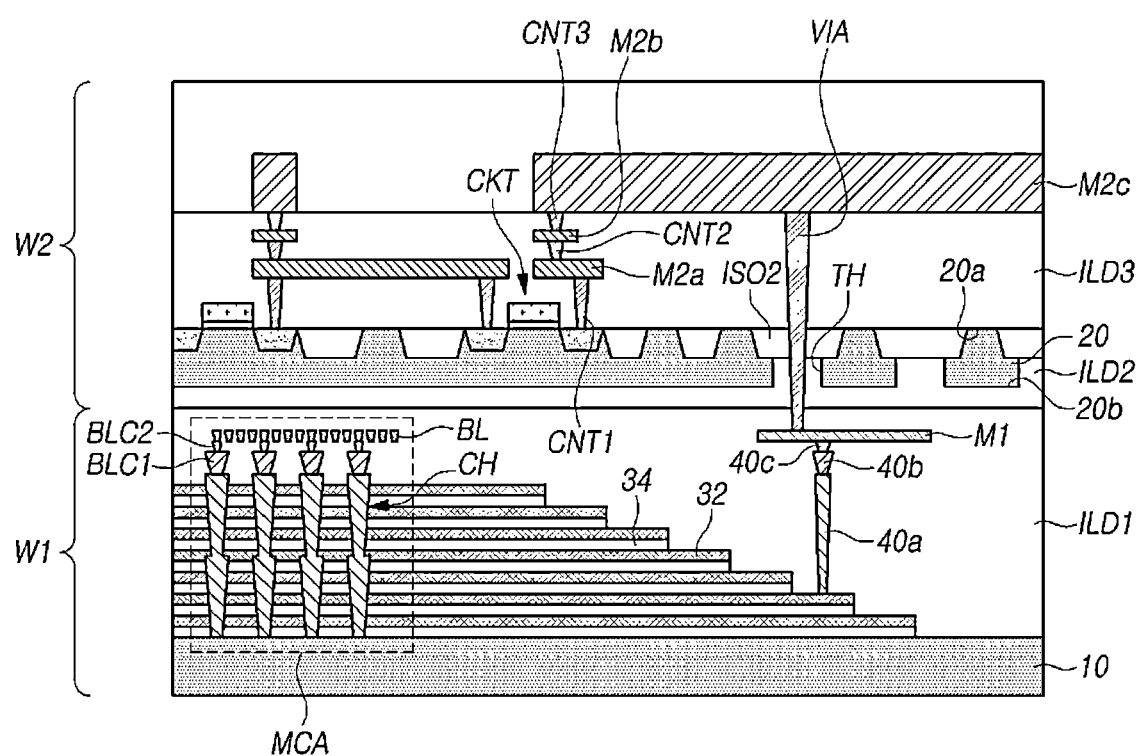
FIG. 11 is a cross-sectional view illustrating a representation of a semiconductor device in accordance with an embodiment of the disclosure.

FIG. 11 is a cross-sectional view illustrating a representation of a semiconductor device in accordance with an embodiment of the disclosure.

Referring to FIG. 11, a lower wafer W1 may include a first substrate 10, and a memory cell array MCA that is defined on the first substrate 10.

The memory cell array MCA may include a plurality of electrode layers 32 and a plurality of interlayer dielectric layers 34, which are alternately stacked on the first substrate 10, and a plurality of vertical channels CH that pass through the plurality of electrode layers 32 and the plurality of interlayer dielectric layers 34.

The electrode layers 32 may include a conductive material. For example, the electrode layers 32 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 32, at least one electrode layer 32 from the lowermost electrode layer 32 may configure a source select line. Among the electrode layers 32, at least one electrode layer 32 from the uppermost electrode layer 32 may configure a drain select line. The electrode layers 32 between the source select line and the drain select line may configure word lines. The interlayer dielectric layers 34 may include silicon oxide.

Although not illustrated, a plurality of first slits that divide the electrode layers 32 and the interlayer dielectric layers 34, alternately stacked, into memory block units may be defined. A second slit, which divides at least one of the drain select line and the source select line into units each smaller than the memory block, for example, sub-block units, may be defined between adjacent first slits. Accordingly, the word lines may be divided into memory block units, and at least one of the drain select line and the source select line may be divided into sub-block units.

The electrode layers 32 may extend in different lengths to form the steps, such as stairway-shaped steps. Accordingly, an underlying electrode layer 32 extends longer than an overlying electrode layer 32, and a pad region that is exposed in an upward direction may be defined in each of the electrode layers 32.

While not illustrated, each of the vertical channels CH may include a channel layer and a gate dielectric layer. The channel layer may include polysilicon or single crystal silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer that are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

Source select transistors may be configured in areas or regions where the source select line surrounds the vertical channels CH. Memory cells may be configured in areas or regions where the word lines surround the vertical channels CH. Drain select transistors may be configured in areas or regions where the drain select line surrounds the vertical channels CH. The source select transistor, the plurality of memory cells and the drain select transistor disposed along one vertical channel CH may configure a cell string.

A plurality of bit lines BL may be disposed over the plurality of electrode layers 32 and the plurality of interlayer dielectric layers 34, alternately stacked, and the plurality of vertical channels CH. The bit line BL may be coupled to the vertical channel CH through bit line contacts BLC1 and BLC2.

A first dielectric layer ILD1 may be defined on the first substrate 10 to cover the plurality of electrode layers 32 and the plurality of interlayer dielectric layers 34 alternately stacked, the vertical channels CH, and the bit lines BL. The top surface of the first dielectric layer ILD1 may configure one surface of the lower wafer W1, which is bonded to an upper wafer W2.

A wiring line M1 may be defined in the first dielectric layer ILD1. The wiring line M1 may be coupled to the memory cell array MCA through contacts 40a to 40c. FIG. 11 illustrates the wiring line M1 coupled to the electrode layer 32 of the memory cell array MCA. While only one wiring line M1 coupled to one of the electrode layers 32 of the memory cell array MCA is illustrated for the sake of simplicity, it should be understood that a plurality of wiring lines, which are respectively coupled to the electrode layers 32, may be defined in the first dielectric layer ILD1.

The upper wafer W2 may include a second substrate 20 and circuit elements CKT, which are defined in the second substrate 20. The circuit elements CKT may control the memory cell array MCA. As an example, the circuit elements CKT may include a row decoder. As another example, the circuit elements CKT may include a page buffer circuit and a peripheral circuit.

Although not illustrated, the row decoder may select any one, from among memory blocks included in the memory cell array MCA, in response to a row address provided from the peripheral circuit. The row decoder may transfer an operating voltage, provided from the peripheral circuit, to word lines coupled to a memory block selected from among the memory blocks included in the memory cell array MCA.

The page buffer circuit may include a plurality of page buffers that are coupled to the bit lines BL, respectively. The page buffer may receive a page buffer control signal from the peripheral circuit, and may transmit and receive a data signal to and from the peripheral circuit. The page buffer may control the bit line BL in response to the page buffer control signal. For example, the page buffer may detect data stored in a memory cell of the memory cell array MCA by sensing a signal of the bit line BL in response to the page buffer control signal, and may transmit the data signal to the peripheral circuit depending on the detected data. The page buffer may apply a signal to the bit line BL based on the data signal received from the peripheral circuit, in response to the page buffer control signal, and accordingly, may write data to a memory cell of the memory cell array MCA. The page buffer may write data to or read data from a memory cell that is coupled to an activated word line.

The peripheral circuit may receive a command signal, an address signal and a control signal from a device outside the semiconductor device, for example, a memory controller, and may transmit and receive data to and from the device to a destination outside of the semiconductor device. The peripheral circuit may output signals for writing data to the memory cell array MCA or reading data from the memory cell array MCA, such as for example, the row address, the page buffer control signal and so forth, based on the command signal, the address signal and the control signal. The peripheral circuit may generate various voltages, including the operating voltage, that are required in the semiconductor device.

A third dielectric layer ILD3 may be defined on a front surface 20a of the second substrate 20 to cover the circuit elements CKT. A wiring line M2c may be disposed on the third dielectric layer ILD3, and may be coupled to the circuit element CKT through wiring lines M2a and M2b and contacts CNT1 to CNT3, which are defined in the third dielectric layer ILD3.

The wiring lines M2a to M2c of the upper wafer W2 may be formed after the lower wafer W1 and the upper wafer W2 are bonded together. The wiring lines M2a to M2c may be formed of a conductive material that has a low resistivity, but is likely to cause a process failure at a maximum temperature (hereinafter, referred to as a 'process critical temperature') during a process of forming the lower wafer W1. For example, the wiring lines M2a to M2c may be formed of copper or aluminum.

Because the upper wafer W2 is formed separately from the lower wafer W1, a material that has a low melting point and a low resistivity may be used as a conductive material that forms the wiring lines M2a to M2c. As the wiring lines M2a to M2c are formed of a material which has a low resistivity, it is possible to reduce the loads of the wiring lines M2a to M2c so that signal transmission speed may be increased.

Under the wiring line M2c, a through via VIA may be coupled to the wiring line M1 by passing through the third dielectric layer ILD3, a second isolation layer ISO2, the second dielectric layer ILD2 under the second isolation layer ISO2 and the first dielectric layer ILD1. The through via VIA may electrically couple the wiring line M2c and the wiring line M1. Although the present embodiment illustrates the through via VIA electrically coupled to the row decoder and the electrode layer 32, the disclosure is not limited thereto. For example, a through via may electrically couple the page buffer circuit and the bit line BL.

According to embodiments of the disclosure, because a through hole TH, which is formed in a substrate of an upper wafer to provide a space for disposing a through via electrically coupling the upper wafer and a lower wafer, may be formed to overlap with an isolation layer, an etch thickness in an etching process for forming the through hole may be reduced. As a consequence, the time of the etching process for forming the through hole may be shortened, and thus, it is possible to contribute to lowering the manufacturing cost and improving the productivity.

According to embodiments of the disclosure, a through hole that is coupled to the isolation layer is formed in the back surface of the substrate of the upper wafer, and a dielectric layer is formed on the back surface of the substrate of the upper wafer including the through hole. As a consequence, the contact area between the dielectric layer and the substrate of the upper wafer may be increased, and the coupling force therebetween may be improved. Accordingly, it is possible to contribute to suppressing, in a subsequent process, the occurrence of a failure in which the lower wafer bonded to the dielectric layer of the upper wafer is misaligned with the upper wafer due to insufficient coupling force at the interface between the substrate of the upper wafer and the dielectric layer.

The above-described exemplary embodiments of the disclosure may be implemented not only through an apparatus and method but also through a program that realizes a function corresponding to a configuration of the exemplary embodiments of the disclosure or through a recording medium on which the program is recorded, and can be easily implemented by a person of ordinary skill in the art from the description of the foregoing exemplary embodiment.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory system comprising:
a memory device; and
a memory controller that transmits and receives data to and from the memory device,
wherein the memory device comprising:
a lower wafer including a first substrate, a memory cell array defined on the first substrate, a first dielectric layer disposed on the first substrate and covering the memory cell array, and a first wiring line that is defined in the first dielectric layer;
an upper wafer including a second substrate, an isolation layer that is defined in an upper surface of the second substrate, a through hole that extends from a lower surface of the second substrate to a lower surface of the isolation layer, a second dielectric layer that fills the through hole, covers the lower surface of the second substrate and is bonded to an upper surface of the first dielectric layer, a logic circuit disposed in the upper surface of the second substrate, a third dielectric layer that is defined on the upper surface of the second substrate and covers the logic circuit, and a second wiring line that is defined on the third dielectric layer; and
a through via passing through the third dielectric layer, the isolation layer, the second dielectric layer and the first dielectric layer, and coupling the second wiring line and the first wiring line.

2. The memory system according to claim 1,
wherein the logic circuit comprising:
a peripheral circuit transmitting and receiving data to and from the memory controller, generating a row address, a page buffer control signal based on external signals received from the memory controller;
a row decoder coupled to the memory cell array through a plurality of word lines, and selecting at least one of the plurality of word lines in response to the row address; and
a page buffer circuit coupled to the memory cell array through a plurality of bit lines, and controlling the plurality of bit lines in response to the page buffer control signal.

3. The memory system according to claim 1,
wherein the external signals include at least one of a command signal, an address signal, and a control signal.

4. The memory system according to claim 1,
wherein the first wiring line is electrically coupled to the memory cell array,
wherein the second wiring line is electrically coupled to the logic circuit, and
wherein the memory cell array is electrically coupled to the logic circuit through the first wiring line, the second wiring line and the through via.

5. The memory system according to claim 1,
wherein the through hole has a vertical height that is smaller than a thickness of the second substrate.

6. The memory system according to claim 1, further comprising:
a dummy isolation layer defined in the upper surface of the second substrate and disposed around the isolation layer.

7. The memory system according to claim 1, wherein a width of the lower surface of the isolation layer is larger than a width of an upper end of the through hole.

8. The memory system according to claim 1, wherein the through hole has a width that widens from the lower surface of the isolation layer to the lower surface of the second substrate.

9. The memory system according to claim 1, wherein the through hole has a width that narrows from the lower surface of the isolation layer to the lower surface of the second substrate.

10. The memory system according to claim 1, wherein the through via comprises:
a first via passing through the isolation layer, the second dielectric layer under the isolation layer, and the first dielectric layer; and
a second via passing through the third dielectric layer under the second wiring line, and coupled to the first via.

11. A memory system comprising:
a memory device; and
a memory controller that transmits and receives data to and from the memory device,
wherein the memory device comprising:
a lower wafer including a first substrate, a memory cell array defined on the first substrate, a first dielectric layer that is defined on the first substrate and covers the memory cell array, and a first wiring line that is defined in the first dielectric layer;
an upper wafer including a second substrate, an isolation layer that is defined in an upper surface of the second substrate, a second dielectric layer, bonded to an upper surface of the first dielectric layer, that covers a lower surface of the second substrate and that includes at least one portion defined in the lower surface of the second substrate below and in contact with the isolation layer, a logic circuit disposed in the upper surface of the second substrate, a third dielectric layer that is defined on the upper surface of the second substrate and covers the logic circuit, and a second wiring line that is defined on the third dielectric layer; and
a through via passing through, under the second wiring line, the third dielectric layer, the isolation layer, the second dielectric layer and the first dielectric layer, and coupling the second wiring line and the first wiring line,
wherein a width of a lower surface of the isolation layer is larger than a width of a top surface of the at least one portion of the second dielectric layer.

12. The memory system according to claim 11, wherein the memory cell array comprising:
a plurality of electrode layers and a plurality of interlayer dielectric layers, that are alternately stacked on the first substrate; and a vertical channel that passes through the plurality of electrode layers and the plurality of interlayer dielectric layers to the first substrate.

13. The memory system according to claim 12, further comprising:
a bit line that is defined in the first dielectric layer, and is coupled to the vertical channel through a bit line contact,
wherein the first wiring line is disposed on the same layer as the bit line.

14. The memory system according to claim 11, wherein the isolation layer has a tapered shape that decreases in width as a distance from the upper surface of the second substrate.

15. The memory system according to claim 11, wherein the at least one portion of the second dielectric layer has a constant width from the lower surface of the second substrate to the lower surface of the isolation layer.

16. The memory system according to claim 11, wherein the at least one portion of the second dielectric layer has a reverse tapered shape that increases in width as a distance from the upper surface of the second substrate.

17. The memory system according to claim 11, wherein the at least one portion of the second dielectric layer has a tapered shape that decreases in width as a distance from the upper surface of the second substrate.

18. The memory system according to claim 11, wherein the second dielectric layer includes at least two portions defined and spaced apart in the lower surface of the second substrate, below and in contact with the isolation layer.

19. The memory system according to claim 11, wherein the first dielectric layer and the second dielectric layer comprise silicon oxide.

20. The memory system according to claim 11, wherein an inner sidewall of the second substrate, defined by the isolation layer and the at least one portion of the second dielectric layer, has a step shape.

* * * * *